US011322417B2

(12) United States Patent
Sunada et al.

(10) Patent No.: US 11,322,417 B2
(45) Date of Patent: May 3, 2022

(54) WIRING BOARD

(71) Applicant: KYOCERA Corporation, Kyoto (JP)

(72) Inventors: Tsuyoshi Sunada, Satsumasendai (JP); Hidetoshi Yugawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 371 days.

(21) Appl. No.: 16/522,302

(22) Filed: Jul. 25, 2019

(65) Prior Publication Data

US 2020/0035575 A1    Jan. 30, 2020

(30) Foreign Application Priority Data

Jul. 26, 2018   (JP) .............................. JP2018-139884

(51) Int. Cl.
*H01L 23/29*    (2006.01)
*H01L 23/498*   (2006.01)
*H01L 23/538*   (2006.01)
*H05K 3/00*     (2006.01)

(52) U.S. Cl.
CPC ...... *H01L 23/291* (2013.01); *H01L 23/49822* (2013.01); *H01L 23/49827* (2013.01); *H01L 23/5383* (2013.01); *H05K 3/0029* (2013.01)

(58) Field of Classification Search
CPC ............. H01L 23/291; H01L 23/49827; H01L 23/5383; H01L 23/49822; H05K 3/0029; H05K 2201/0269; H05K 2201/096; H05K 1/0271; H05K 3/429
See application file for complete search history.

(56) References Cited

U.S. PATENT DOCUMENTS

| | | | |
|---|---|---|---|
| 2001/0030365 A1* | 10/2001 | Otsuka ............. | H01L 21/76816 257/758 |
| 2010/0103634 A1* | 4/2010 | Funaya .................. | H05K 1/185 361/761 |
| 2017/0103942 A1 | 4/2017 | Oi et al. | |
| 2017/0271242 A1* | 9/2017 | Lo ..................... | H01L 21/76898 |

FOREIGN PATENT DOCUMENTS

| | | |
|---|---|---|
| JP | 3851768 B2 | 11/2006 |
| JP | 2017-073520 A | 4/2017 |
| WO | 2008-120755 A1 | 10/2008 |

* cited by examiner

*Primary Examiner* — Benjamin Tzu-Hung Liu
(74) *Attorney, Agent, or Firm* — Volpe Koenig

(57) ABSTRACT

A wiring board of the present disclosure includes: a first insulating layer including a surface; a second insulating layer including un upper surface and a lower surface and locating above the surface of the first insulating layer; a wiring conductor layer formed on the surface of the first insulating layer, includes a via land; and a via hole conductor penetrating from the upper surface to the lower surface of the second insulating layer. The via hole conductor includes a via bottom being in contact with the via land. Crystal grains in the via bottom are smaller than crystal grains in the via land.

7 Claims, 2 Drawing Sheets

WIRING BOARD

BACKGROUND OF THE INVENTION

1. Technical Field

The present disclosure relates to a wiring board.

2. Background

The wiring board includes a plurality of insulating layers and wiring conductor layers formed on the surfaces of the insulating layers, as shown in, for example, Japanese Patent Application Laid-Open No. 2017-73520 and Japanese Patent No. 3851768. A via hole conductor is formed in the insulating layer, and through the via hole conductor, electrical connection is made between the wiring conductor layers formed in different insulating layers, that is, electrical connection is made in the thickness direction of the wiring board.

SUMMARY

A wiring board of the present disclosure includes: a first insulating layer including a surface; a second insulating layer including un upper surface and a lower surface and locating above the surface of the first insulating layer; a wiring conductor layer formed on the surface of the first insulating layer, includes a via land; and a via hole conductor penetrating from the upper surface to the lower surface of the second insulating layer. The via hole conductor includes a via bottom being in contact with the via land. Crystal grains in the via bottom are smaller than crystal grains in the via land.

DETAILED DESCRIPTION

Figure 1:
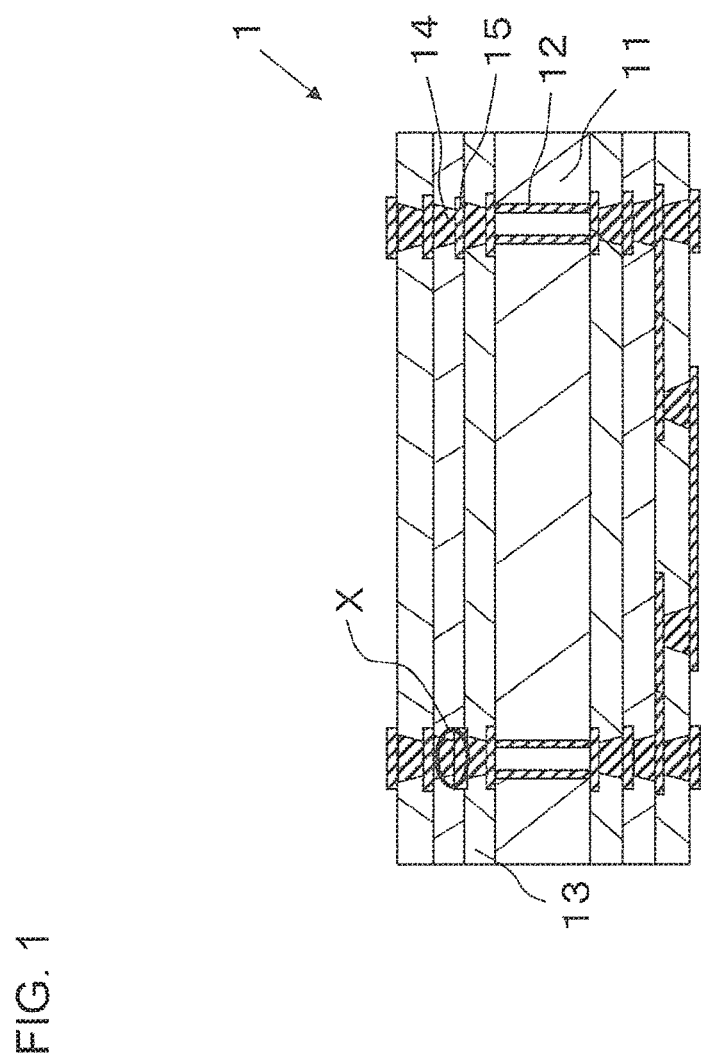
FIG. 1 is a cross-sectional view illustrating a wiring board according to one embodiment of the present disclosure.

In a via hole conductor formed in an insulating layer, thermal stress occurs due to, for example, heating or the like when a semiconductor element is mounted. Due to the thermal stress, a crack occurs at a contact surface between a bottom portion of the via hole conductor (via bottom) and a via land, or the contact surface peels off. If such a crack or peeling occurs, an electric signal cannot be satisfactorily transmitted through a wiring conductor. As a result, electrical reliability is reduced, such as a semiconductor element not stably operating.

In a wiring board of the present disclosure, crystal grains in the bottom portion of the via hole conductor (via bottom) are smaller than crystal grains in the via land. That is, at the contact surface between the via bottom and the via land where the thermal stress increases, the via bottom is formed of fine crystal grains. Therefore, even if thermal stress occurs and the crystal expands, an expansion direction is likely to disperse in all directions, and the crack and the peeling are less likely to occur.

The wiring board of the present disclosure includes a first insulating layer including a surface, a second insulating layer including un upper surface and a lower surface and locating above the surface of the first insulating layer, a wiring conductor layer formed on the surface of the first insulating layer, includes a via land, and a via hole conductor penetrating from the upper surface to the lower surface of the second insulating layer.

A wiring board according to one embodiment will be described with reference to FIGS. 1 to 3. The wiring board 1 according to one embodiment illustrated in FIG. 1 includes a core layer 11 and insulating layers 13 laminated on both sides of the core layer 11. In the wiring board 1 of the one embodiment, the core layer 11 corresponds to the first insulating layer and the insulating layer 13 corresponds to the second insulating layer. That is, the first insulating layer may include the core layer. The core layer 11 is not particularly limited if formed of an insulating material. Examples of the insulating material include resins such as epoxy resin, bismaleimide-triazine resin, polyimide resin and polyphenylene ether resin. These resins may be used by mixing two or more. The thickness of the core layer 11 is not particularly limited, and is, for example, 50 to 3000 μm.

The core layer 11 may contain a reinforcing material. Examples of reinforcing materials include insulating cloth materials such as glass fiber, glass nonwoven fabric, aramid nonwoven fabric, aramid fiber, and polyester fiber, for example. The reinforcing material may be used in combination of two or more. Furthermore, inorganic insulating fillers such as silica, barium sulfate, talc, clay, glass, calcium carbonate, titanium oxide, and the like may be dispersed in the core layer 11.

A through hole conductor 12 is formed in the core layer 11 in order to electrically connect upper and lower surfaces of the core layer 11. The through hole conductor 12 is formed into a through hole penetrating the upper and lower surfaces of the core layer 11. The through hole conductor 12 is formed of, for example, a conductor made of metal plating such as copper plating. The through hole conductor 12 is connected to wiring conductor layers formed on both sides of the core layer 11. A via land 15 is included in the formed wiring conductor layer. The wiring conductor layer will be described below. Regarding the through hole conductor 12 formed in the wiring board 1 illustrated in FIG. 1, the conductor is formed only on an inner wall surface of the through hole formed in the core layer 11. However, the conductor forming the through hole conductor 12 may be filled in the through hole.

The insulating layers 13 are laminated on both sides of the core layer 11. In the wiring board 1 illustrated in FIG. 1, three insulating layers 13 are laminated on each side. Similarly to the core layer 11, the insulating layer 13 is not particularly limited if formed of an insulating material. Examples of the insulating material include resins such as epoxy resin, bismaleimide-triazine resin, polyimide resin and polyphenylene ether resin. These resins may be used by mixing two or more. Each insulating layer 13 may be formed of the same resin, or may be formed of a different resin. The insulating layer 13 and the core layer 11 may be formed of the same resin, or may be formed of different resins. Furthermore, inorganic insulating fillers such as silica, barium sulfate, talc, clay, glass, calcium carbonate, titanium oxide, and the like may be dispersed in the insulating layer 13. These inorganic insulating fillers may be used by mixing two or more.

The thickness of the insulating layer 13 is not particularly limited, and is, for example, 3 to 50 μm. Each insulating layer 13 may have the same thickness or may have a different thickness.

The wiring conductor layer is formed on the surface of the core layer 11 and the insulating layer 13, and formed by depositing an electroless copper plating layer and an electrolytic copper plating layer on the surface of the insulating layer 13 by, for example, a known semi-additive method. Specifically, it is as follows. First, electroless copper plating treatment is performed on the surfaces of the core layer 11 and the insulating layer 13. After the treatment, the treated object is dried and a pattern is formed with a plating resist. The portion where the pattern is not formed is masked by plating resist such as a dry film. Then, performing electrolytic copper plating grows a pattern only in the exposed portion of the electroless copper plating. After the electrolytic copper plating treatment, the plating resist is peeled off, and only the electroless copper plating is removed by etching.

Alternatively, the wiring conductor layer can be obtained by the following method. First, a dry film being etching resist is attached to an insulating plate having a conductor (for example, copper foil or the like) formed on the surface by a publicly known method to be exposed and developed. Thereafter, peeling off the dry film by etching forms a wiring conductor layer on the surface of the core layer 11 and the surface of the insulating layer 13.

In the insulating layer 13, a via hole filled with a via hole conductor 14 for electrically connecting between the layers is formed. A plurality of via holes are formed by laser machining such as a $CO_2$ laser or a UV-YAG laser. The via hole may have a diameter of, for example, 3 to 100 μm. The via hole is filled with the via hole conductor 14, and the via bottom of the via hole conductor 14 is in contact with the via land 15 included in the wiring conductor layer. Hereinafter, the via hole conductor 14 will be described with reference to FIGS. 2 and 3.

Figure 2:
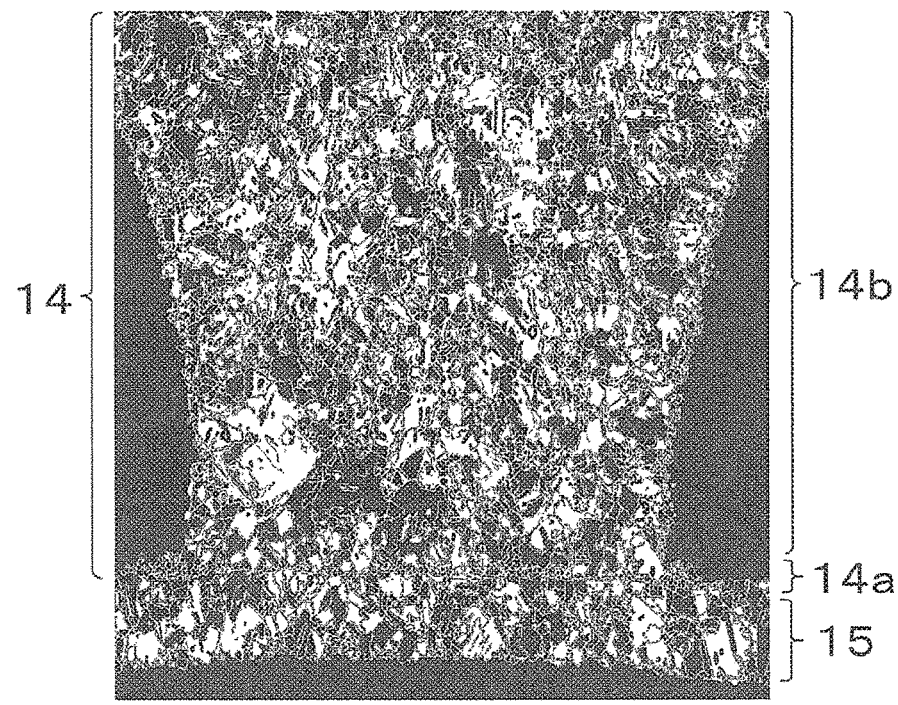
FIG. 2 is an enlarged cross-sectional view illustrating a state of crystal grains constituting an X region illustrated in FIG. 1.

FIG. 2 is an enlarged cross-sectional view illustrating an X region illustrated in FIG. 1. FIG. 3 is an explanatory diagram schematically illustrating an example of crystal grains forming the via hole conductor 14 illustrated in FIG. 1. The via hole conductor 14 illustrated in FIG. 2 is in contact with the via land 15. Specifically, as illustrated in FIGS. 2 and 3, the bottom portion of the via hole conductor 14 (via bottom 14a) is in contact with the via land 15. Herein, the "via bottom" means, when a via hole formed in an insulating layer is filled with a via hole conductor, a metal (via hole conductor) portion to be deposited in the early stage of plating treatment on the surface of the via land formed to close the bottom of the via hole. That is, in the wiring board 1 illustrated in FIG. 1, the core layer 11 side in each via hole conductor 14 corresponds to the "via bottom".

The thickness of the via bottom 14a is not particularly limited, and for example, is 0.1 to 10 and may be 0.5 to 4, as a relative value when the height of the via hole conductor 14 is assumed to be 100. In the via hole conductor 14, a portion located above the via bottom 14a is expediently described as a first portion 14b.

Figure 3:
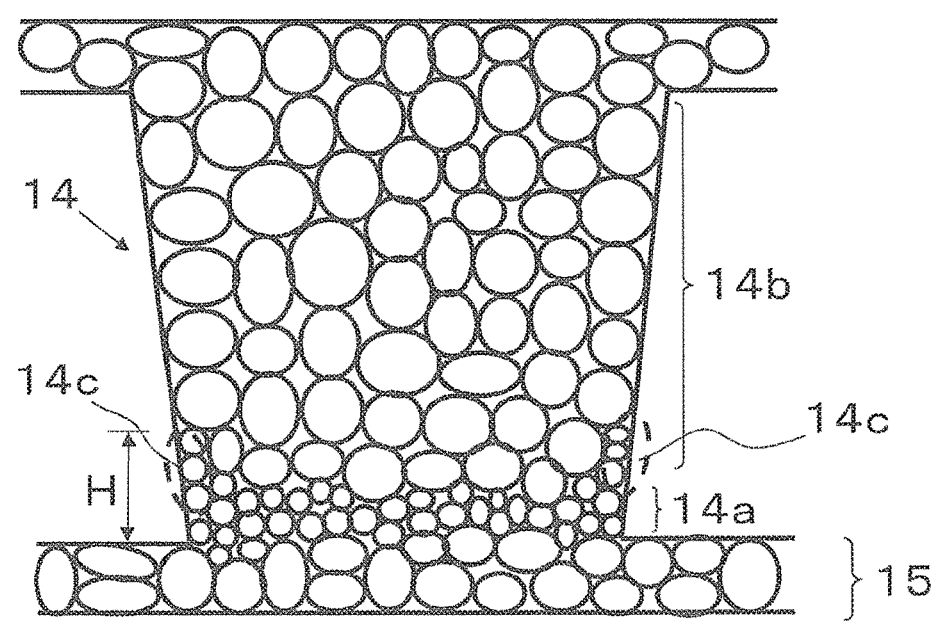
FIG. 3 is an explanatory diagram schematically illustrating an example of crystal grains forming a via hole conductor illustrated in FIG. 1.

As illustrated in FIGS. 2 and 3, the crystal grains forming the via bottom 14a have a smaller mean grain size than the crystal grains forming the via land 15. Therefore, even if thermal stress occurs and the crystal expands, the expansion direction is likely to disperse in all directions, and the crack and the peeling are less likely to occur between the via bottom 14a and the via land 15. Furthermore, the crystal grains forming the via bottom 14a may have a smaller mean grain size than the crystal grains forming the first portion 14b as illustrated in FIGS. 2 and 3.

The mean grain size of the crystal grains forming the via bottom 14a is not limited if smaller than the mean grain size of the crystal grains forming the via land 15. The mean grain size of the crystal grains forming the via bottom 14a is, for example, 1 to 20 and may be 5 to 10, as a relative value when the mean grain size of the crystal grains forming the via land 15 is assumed to be 100.

The via hole conductor 14 illustrated in FIG. 3 includes a second portion 14c located in an outer peripheral portion of the via hole conductor 14 and extending from the via bottom 14a in a height direction of the via hole conductor 14. Thus, not only the via bottom 14a in contact with the via land 15 but also the second portion 14c of the via hole conductor 14 being formed of fine crystal grains as in the via bottom 14a allows the stress at the triple point where the insulating layer 13, the via hole conductor 14, and the via land 15 are in contact with each other to be reduced. This is advantageous in that distortion caused by, for example, thermal stress is reduced, the occurrence of cracks near the triple point is suppressed, and the conduction characteristic between the via hole conductor 14 and the via land 15 is maintained.

A height H from the via bottom 14a is not particularly limited for the second portion 14c formed of fine crystal grains as in the via bottom 14a. For example, the height H from the via bottom 14a is not more than 20 and may be not more than 10, as the relative value when the height of the via hole conductor 14 is assumed to be 100.

The method for manufacturing the wiring board of the present disclosure is not particularly limited. For example, the wiring board 1 according to one embodiment can be obtained by the following method.

First, the core layer 11 in which the through hole conductor 12 is formed is prepared. The through hole conductor 12 is obtained by depositing a conductor made of metal plating such as copper plating on the inner wall surface of the through hole formed to penetrate the upper and lower surfaces of the core layer 11, for example. The through hole is formed, for example, by drilling, laser machining, or blast machining. The thickness of the core layer 11 is as described above, and is, for example, 50 to 3000 μm.

Next, wiring conductor layers are formed on both surfaces of the core layer 11. Regarding the wiring conductor layer, a dry film being etching resist is attached to the conductor (copper foil) formed on both surfaces of the core layer 11 by a publicly known method to be exposed and developed. Thereafter, peeling off the dry film by etching forms a wiring conductor layer on both surfaces of the core layer 11. The formed wiring conductor layer includes the via land 15. The through hole conductor 12 formed in the core layer 11 is electrically connected to the wiring conductor layers formed on both surfaces of the core layer 11.

Next, the insulating layers 13 are formed on the upper and lower surfaces of the core layer 11. The insulating layer 13 is formed, for example, by placing a film for the insulating layer 13 on the upper and lower surfaces of the core layer 11 and heat pressing. The thickness of the insulating layer 13 is as described above, and is, for example, 3 to 50 μm. Next, the via hole conductor 14 is formed in the insulating layer 13. First, a via hole is formed in the insulating layer 13. The via hole is formed such that the via land 15 included in the wiring conductor layer is at the bottom. The via hole is formed, for example, by a $CO_2$ laser, a UV-YAG laser, or the like. The diameter of the via hole is as described above, and is, for example, 5 to 100 μm. Performing electroless plating treatment and electrolytic plating treatment on the formed via hole forms the via hole conductor 14.

When the electrolytic plating treatment is performed, increasing the current density at the initial stage of the treatment deposits a metal formed of fine crystal grains, first, from a part in contact with the via land 15 to the bottom portion of the inner wall surface of the via hole. The metal formed of the fine crystal grains corresponds to the via bottom 14*a* and the second portion 14*c*. Thereafter, reducing the current density of the plating treatment deposits the metal formed of relatively large crystal grains. The relatively large crystal grains correspond to the first portion 14*b*, the via hole is filled with the first portion 14*b*, and the via hole conductor 14 is formed.

A wiring conductor layer is also formed on the surface of the insulating layer 13. The method for forming the wiring conductor layer is not particularly limited, and depositing copper plating metal on the surface of the insulating layer 13 by, for example, a semi-additive method forms the wiring conductor layer.

Further twice repeating the process of forming the insulating layer 13 and the wiring conductor layer obtains the wiring board 1. The thickness of the via bottom 14*a*, the mean grain size of the crystal grains forming the via bottom 14*a*, and the second portion 14*c* ("height H" shown in FIG. 3) are as described above, and the description will be omitted.

The wiring board of the present disclosure is not limited to the one embodiment described above. For example, in the wiring board 1 described above, three insulating layers 13 are laminated on each surface of the core layer 11. However, since the core layer 11 is also an insulating layer, at least one insulating layer 13 has only to be formed on at least one surface of the core layer 11 in the wiring board of the present disclosure. Furthermore, the number of layers of the insulating layers 13 formed in the core layer 11 may be different between the upper and lower surfaces.

The above-described wiring board 1 includes the core layer 11. However, in the wiring board of the present disclosure, the core layer 11 is not an essential member but an optional member. Therefore, the wiring board of the present disclosure may be in the form of a coreless board.

What is claimed is:

1. A wiring board comprising:
a first insulating layer comprising a surface;
a second insulating layer comprising un upper surface and a lower surface and locating above the surface of the first insulating layer;
a wiring conductor layer formed on the surface of the first insulating layer, includes a via land; and
a via hole conductor penetrating from the upper surface to the lower surface of the second insulating layer,
wherein the via hole conductor comprises a via bottom being in contact with the via land,
wherein crystal grains in the via bottom are smaller than crystal grains in the via land,
wherein the via hole conductor comprises a second portion located in an outer peripheral portion of the via hole conductor and extending from the via bottom in a height direction of the via hole conductor, and
wherein the crystal grains in the second portion are smaller than the crystal grains in the via land.

2. The wiring board according to claim 1, wherein
the via hole conductor comprises a first portion located above the via bottom, and
the crystal grains in the via bottom are smaller than crystal grains in the first portion.

3. The wiring board according to claim 1, wherein a mean grain size of the crystal grains in the via bottom is 1 to 20, as a relative value when a mean grain size of the crystal grains in the via land is assumed to be 100.

4. The wiring board according to claim 1, wherein a thickness of the via bottom is 0.1 to 10, as a relative value when a height of the via hole conductor is assumed to be 100.

5. The wiring board according to claim 1, wherein both a mean grain size of the crystal grains in the via bottom and a mean grain size of the crystal grains in the second portion are 1 to 20, as a relative value when a mean grain size of the crystal grains in the via land is assumed to be 100.

6. The wiring board according to claim 1, wherein a height of the second portion is not more than 20, as a relative value when a height of the via hole conductor is assumed to be 100.

7. The wiring board according to claim 1, wherein the second insulating layer contains at least one of inorganic insulating filler selected from the group consisting of silica, barium sulfate, talc, clay, glass, calcium carbonate, titanium oxide.

* * * * *